United States Patent [19]
Mallory et al.

[11] Patent Number: 5,642,298
[45] Date of Patent: Jun. 24, 1997

[54] WAFER TESTING AND SELF-CALIBRATION SYSTEM

[75] Inventors: Roy E. Mallory, Bedford, Mass.; Peter Domenicali, Montepelier, Vt.; Noel S. Poduje, Needham Heights, Mass.; Alexander Belyaev, Wayland, Mass.; Peter A. Harvey, Wilmington, Mass.; Richard S. Smith, Harvard, Mass.

[73] Assignee: ADE Corporation, Newton, Mass.

[21] Appl. No.: 613,820

[22] Filed: Feb. 26, 1996

Related U.S. Application Data

[63] Continuation-in-part of Ser. No. 197,394, Feb. 16, 1994, Pat. No. 5,511,005.

[51] Int. Cl.⁶ .................................................... G01R 1/04
[52] U.S. Cl. ............... 364/561; 364/167.01; 364/478.06; 364/552; 324/757; 324/765; 414/225; 414/226; 414/935; 414/936; 414/937; 414/939; 414/941
[58] Field of Search ............................ 364/561, 478.06, 364/167.01, 552; 324/757, 765; 414/225, 226, 935, 936, 937, 939, 941

[56] References Cited

U.S. PATENT DOCUMENTS

| | | | |
|---|---|---|---|
| H1373 | 11/1994 | Durham et al. | 414/786 |
| 2,767,914 | 10/1956 | Merrill et al. | 364/552 |
| 3,039,056 | 6/1962 | Many et al. | 324/765 |
| 3,039,604 | 6/1962 | Bicket et al. | 324/765 X |
| 3,775,679 | 11/1973 | Abbe | 324/61 R |
| 3,940,243 | 2/1976 | Adams | 432/144 |
| 3,986,109 | 10/1976 | Poduje | 324/61 R |
| 3,990,005 | 11/1976 | Abbe et al. | 324/61 R |
| 4,103,232 | 7/1978 | Sugita et al. | 324/754 |
| 4,217,542 | 8/1980 | Abbe et al. | 324/57 R |
| 4,219,110 | 8/1980 | Ubukata | 198/380 |
| 4,311,427 | 1/1982 | Coad et al. | 414/227 |
| 4,449,885 | 5/1984 | Hertel et al. | 414/750 |
| 4,457,664 | 7/1984 | Judell et al. | 414/779 |
| 4,556,317 | 12/1985 | Sandland et al. | 356/237 |
| 4,618,938 | 10/1986 | Sandland et al. | 364/552 |
| 4,638,601 | 1/1987 | Steere et al. | 51/165.71 |
| 4,644,172 | 2/1987 | Sandland et al. | 250/548 |
| 4,703,252 | 10/1987 | Perloff et al. | 324/62 |
| 4,733,091 | 3/1988 | Robinson et al. | 250/492.2 |
| 4,750,141 | 6/1988 | Judell et al. | 364/550 |
| 4,755,746 | 7/1988 | Mallory et al. | 324/719 X |
| 4,789,294 | 12/1988 | Sato et al. | 414/416 |
| 4,803,882 | 2/1989 | Schonfeld et al. | 73/462 |
| 4,836,733 | 6/1989 | Hertel et al. | 414/225 |
| 4,849,916 | 7/1989 | Abbe et al. | 364/563 |
| 4,860,229 | 8/1989 | Abbe et al. | 364/563 |
| 4,881,863 | 11/1989 | Braginsky | 414/225 |
| 4,904,153 | 2/1990 | Iwasawa et al. | 414/735 |
| 4,911,597 | 3/1990 | Maydan et al. | 414/217 |
| 4,931,962 | 6/1990 | Palleiko | 364/550 |
| 5,046,909 | 9/1991 | Murdoch | 414/225 |
| 5,100,276 | 3/1992 | Iwasaki et al. | 414/222 |
| 5,164,905 | 11/1992 | Iwasaki et al. | 364/478 X |
| 5,224,809 | 7/1993 | Maydan et al. | 414/217 |
| 5,270,222 | 12/1993 | Moslehi | 437/8 |
| 5,295,777 | 3/1994 | Hodos | 414/217 |
| 5,325,052 | 6/1994 | Yamashita | 324/158 P |
| 5,456,561 | 10/1995 | Poduje et al. | 414/225 |
| 5,479,108 | 12/1995 | Cheng | 324/765 |

*Primary Examiner*—Emanuel T. Voeltz
*Assistant Examiner*—Hien Vo
*Attorney, Agent, or Firm*—Weingarten, Schurgin, Gagnebin & Hayes LLP

[57] ABSTRACT

A measurement station which rotates a wafer in a vertical plane and moves a scanning sensor linearly along an axis which is parallel to the wafer rotation plane, thus providing a spiral, or other, scan path across the wafer. The vertical orientation reduces errors from weight induced sagging, especially of large, e.g. 300 mm wafers. The measurement station includes wafer grippers which move in the wafer's plane for securing the wafer in position for rotation. The measurement station also includes master calibration gauges which simplify calibration and obviate the need for calibration test wafers. A technique for reducing vibration and assuring scan repeatability includes coasting of the wafer in rotation and coordinated linear probe motions for scanning. Probe measurement data obtained is digitized early and calibration, demodulation, filtering and other processing is done digitally.

11 Claims, 10 Drawing Sheets

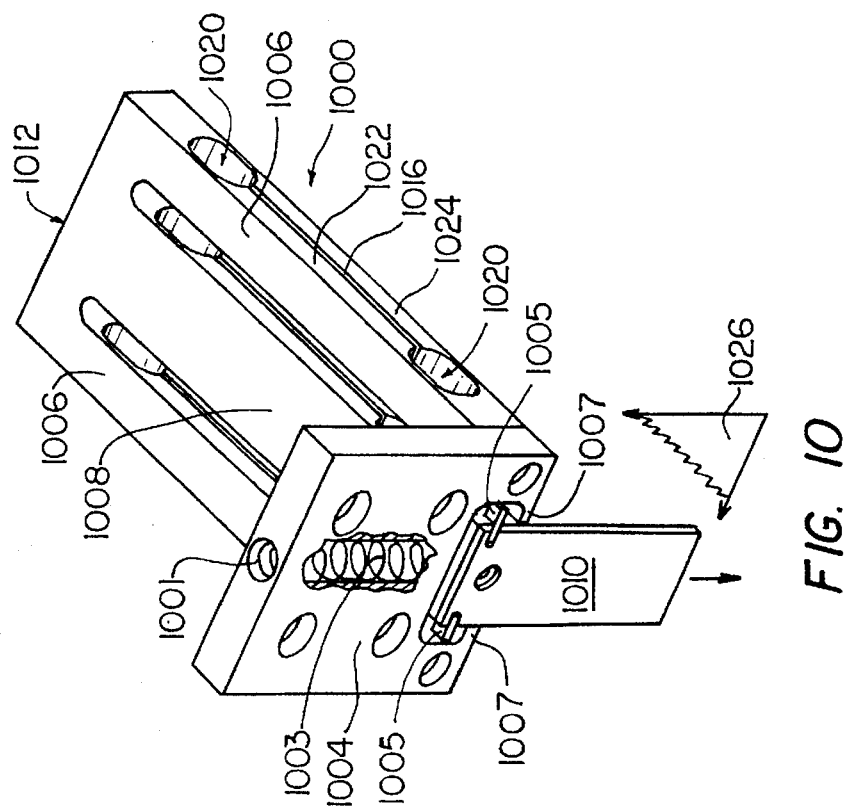
FIG. 10
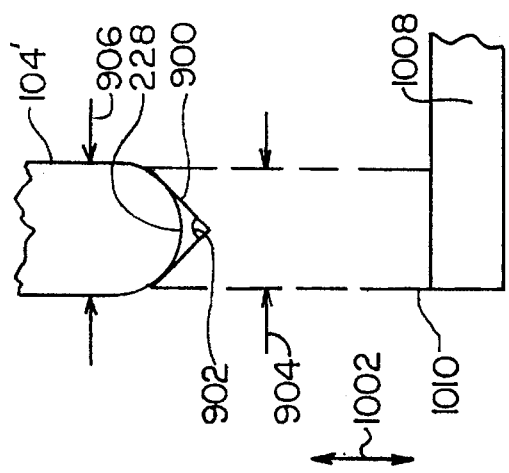
FIG. 10A
FIG. 9

5,642,298

WAFER TESTING AND SELF-CALIBRATION SYSTEM

RELATED APPLICATION

This is a continuation-in-part of application Ser. No. 08/197,394, filed Feb. 16, 1994, now U.S. Pat. No. 5,511,005, which is incorporated herein by reference.

FIELD OF THE INVENTION

This invention relates generally to wafer handling and measurement apparatus, and more particularly to an improved wafer handling, processing and measurement system.

BACKGROUND OF THE INVENTION

Processing machinery for handling and measuring semiconductor wafers is known. Such machinery typically includes one or more measurement stations which receive wafers and measure various different wafer parameters which are relevant to quality control. Carrier containers are used for storing and transporting wafers to and from the measurement station and other stations. It is generally desirable to have a measurement station with a fast throughput rate, high accuracy and low cost.

SUMMARY OF THE INVENTION

In accordance with the present invention, a measurement station includes a rotor which securely holds and rotates a wafer in a plane; and arm mounted scanning sensor operative to move linearly along an axis which is parallel to the wafer rotation plane, thereby providing a spiral or other scan path. The rotor includes a plurality of grippers which securely hold the wafer. The grippers are mounted to the rotor on flexures which keep them in the plane of the wafer over the range of gripper travel. At least some of the grippers have a spring suspension for spring loading the wafer against at least two of the grippers, the at least two grippers being stationary with respect to the rotor during wafer support in the grippers. The measurement station may also include a plurality of calibration gauges supported on the rotor in the plane of the wafer and of varying thickness and position and grouped in plural segments detachable from the rotor and with the gauges detachable from each segment.

The measurement station of the present invention advantageously provides improved accuracy and throughput speed. The grippers provide improved measurement point calculation. By utilizing two stationary grippers with known position, the present invention provides improved measurement position certainty for probe calculations in comparison to measurement stations in which all gripping apparatus are moveable. Further, since the movable grippers of the present invention are limited to movement in a predetermined axis, measurement point calculation is simplified in comparison with measurement stations in which grippers move arcuately. This improved speed and accuracy is most advantageous with large diameter wafers, such a 300 mm diameter wafers.

The master calibration gauges of the present invention provide improved accuracy and throughput speed by obviating the need for handling and exchanging calibration wafers and by allowing calibration while a wafer to be measured is in place for measurement. To calibrate, the rotor and masters are rotated and the sensor applied to sense the ring-mounted masters to provide comparative points of capacitance variation from which calibration constants are calculated by a statistical fit of the parameters of the probe transfer function to the data from the masters. Six factors, including linearity, scale factor and offset for both probes are thereby determined simultaneously, without the need for shuffling wafers into and out of the measurement station.

The rotor is a toroidal air bearing structure which is accelerated to measurement speed and coasts during probe data collection. The probe arm is an air bearing supported structure that holds the probes in positions to scan both sides of a wafer during rotation of the wafer. Rotary and linear encoders on the rotor and probe arm allow coordinated movement of the probe arm describing a scan of spiral or other shape. The probe arm is kinematically supported on the air bearing.

The probes' raw data is digitized and then digitally calibrated, demodulated and filtered. Other signal processing can be subsequently performed for presentation or other purposes.

BRIEF DESCRIPTION OF THE DRAWING

The foregoing features of this invention as well as the invention itself, may be more fully understood from the following detailed description of the drawing in which:

FIG. 8 illustrates the gripper;

FIG. 9 is a perspective view of the gripper assembly;

FIG. 10A is a top view of the gripper assembly;

DETAILED DESCRIPTION

Figure 1:
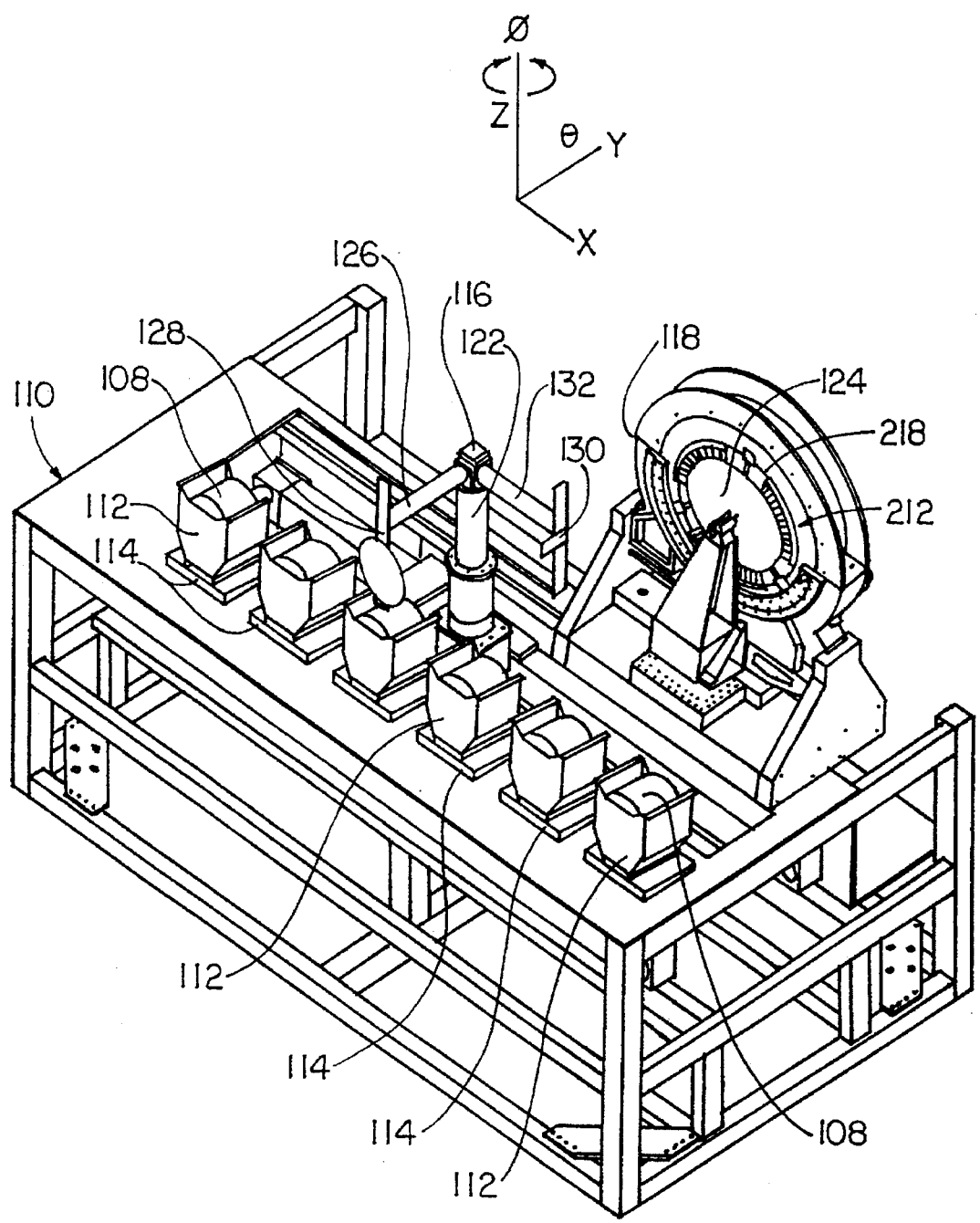
FIG. 1 is an isometric view of wafer handling and measurement apparatus in accordance with the present invention.
Figure 3:
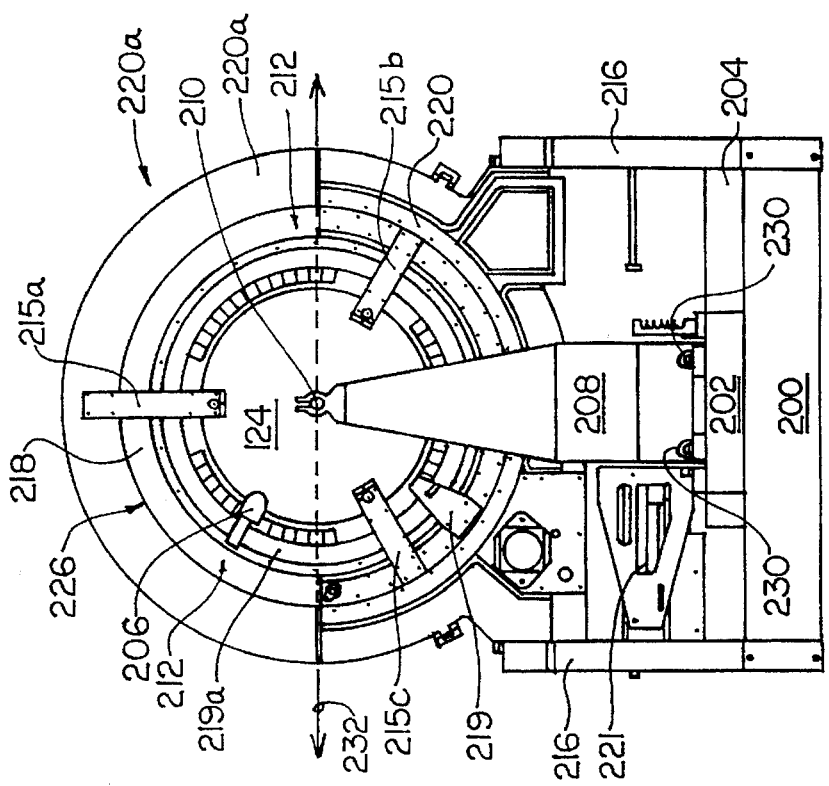
FIG. 3 is a back view of the measurement station.

As shown in FIG. 1, a wafer handling and processing system includes a support frame 110 having a supply of wafers 108 in wafer holders 112 on preestablished locations 114 of the frame 110 where a robot 116 can retrieve wafers 124 one at a time to place them in the grippers, described within, of a measurement station 118. When the series of measurements, typically flatness, thickness, and shape, on a wafer are completed in measurement station 118, the robot 116 returns them to the same or different holder 112.

The robot 116 is mounted on the frame 110 on a slide and track assembly that allows the robot to move in computer controlled X and Y directions over the frame 110. The robot has a vertically (Z), tilt (Phi) and rotationally (Theta) movable shaft 122 that supports an arm 126 that further holds a vertical paddle 128. The paddle 128 is moved down behind a desired wafer under computer control and picks up the wafer by the activation of fingers 130 thereon. The arm 126 is raised and rotated through a position 132, while the robot is positioned in X and Y and tilt, to a position opposite for precise placement of the wafer into the plane of rotation of the wafer in measurement station 118 where grippers, described below, having been previously spread to permit wafer insertion, close on and thus pick up the wafer while the grabbers release the wafer. The robot arm 126 is then returned to an out-of-the-way position before measurement of a wafer begins There is enough flexibility in the paddle 128 to accommodate minor misalignments with the plane of rotation of the wafer in measurement station 118 to insure proper seating of the wafer in V grooves of the grippers of the measurement station 118.

Referring to FIGS. 2–7, the measurement station includes a base 200, a linear air bearing 202, a guide rail 204, an optical edge sensor 206, a probe arm 208, two sensors 210, three sets of master calibration gauges 212, three grippers 214a, 214b, 214c, support plates 216, an air bearing rotor 218, an air bearing stator 220 for the rotor 218, a rotor drive 222 and a probe arm drive 224. The air bearing, 226, typically has two radial support bearings and two axial thrust bearings to keep the rotor 218 in a well defined and stable plane of rotation. The stator 220 may be of a single 180 degree section with a cover 220a as shown. The optical edge sensor 206 is employed to detect fiducial and edge position. The probe arm 208 is disposed upon the probe arm carriage 202. The probe arm carriage 202, guide rail 204 and base 200 form an air bearing to support the probe arm in Y and Z.

The grippers 214 and master calibration gauges are disposed on the rotor. Rotary encoder 219, including scale 219a, and linear encoder 221 measure rotor 218 and arm 208 positions. For insertion and removal of a wafer 124 by robot 116, the grippers are positioned to locations which prevent interference with the arm 126 of the robot. The grippers hold the wafer in a plane 231 that is about ¼ inch outbound of the face of rotor 218.

Before being measured, a wafer is loaded into the measurement station. The wafer is securely held in a vertical position by the grippers 214a–c. The wafer is then rotated at a predetermined rate by the drive 222 for rotor 218. When the wafer reaches a predetermined rotation rate, the drive is disabled by declutching and then the sensors 210 are moved linearly from wafer center or edge 228 to edge or center 229 using a control loop that detects rotor position and moves the arm in coordination to define a spiral or other pattern on wafer 124 while measuring wafer characteristics. When the wafer surface 124 has been measured, the rotor ceases rotation and the wafer is removed from the measurement station.

The grippers 214a–c function to hold the wafer in a repeatable position for measurement. During measurement, two grippers, e.g. 214a, b are stationary and the other gripper 214c is movable. In order for a wafer to be placed in position for measurement the grippers are opened by actuators 215 on stator 220 with the grippers aligned therewith. The wafer is moved into position with the wafer plane aligned with the plane of the grippers. The wafer is inserted between the grippers which are released from actuators 215 into contact with the wafer edge and apply inward force thereto such that the wafer is held securely to the rotor by all three grippers. As shown in FIG. 8, the grippers have a V-groove 900 which guides the wafer edge to a predetermined position. The V-groove has a V-angle 902 of approximately 90 degrees and a block depth 904 which is thin enough to allow passage of the probes. Since two of the grippers are stationary during measurement and have precisely known positions relative to the sensor and the wafer, the wafer center position is repeatable. The optical sensor 206 provides data on edge, fiducial and center position for correlating the wafer measurement data to exact wafer position in computer 2001, below, as is known in the art.

The grippers 214 are attached to the rotor with flexures 1000 shown in FIGS. 9, 10A. Each flexure advantageously maintains gripper movement in a single axis 1002. The flexure includes a base plate 1004 which is directly connected to the rotor and is also connected to two parallel arms 1006 at a first end. A center arm 1008 is connected to the parallel arms at a second end and is connected to the gripper finger V-groove block 1010 at an opposing end, thereby forming a W-shaped flexure support 1012. This arrangement provides two counteracting hinge axes 1014a, 1014b which maintain gripper finger movement in the predetermined axis as pressure is applied to the center arm in order to secure a wafer. The counteracting action of the hinge axes is assisted by splits 1016 in the arms which have cutouts 1020 at either end. The splits and cutouts allow the arms to function as parallelograms. That is, the upper and lower sections 1022 and 1024 of each arm flex such that the wafer will be held in a predetermined plane. This design simplifies wafer positioning as compared with grippers having arcuate motion. Two of the flexures 1000 have their inward motion limited by hard stops formed by pins 1005 and edges 1007. The other flexure has a greater range of travel and is the only one whose position is dependent on wafer size. A spring 1003 is placed through a hole 1001 in plate 1004 to bear against arm 1008 adjacent to the block 1010 of each flexure to insure that the hard stops are met and the more movable block 1010 is properly spring loaded. The springs 1003 of the two flexures limited by hard stops are stronger to insure the hard stops are maintained.

The actuators 1028 are disposed equidistantly on the stator 220. As previously described, the stator does not rotate during measurement. Hence, the grippers can only be actuated when aligned with the actuators. Significantly, the gripper may contact and secure the wafer at a fiducial point where the fiducial is a mere notch. With a flat fiducial the grippers must avoid the flat, e.g. by pre positioning it before loading.

Figure 10B:
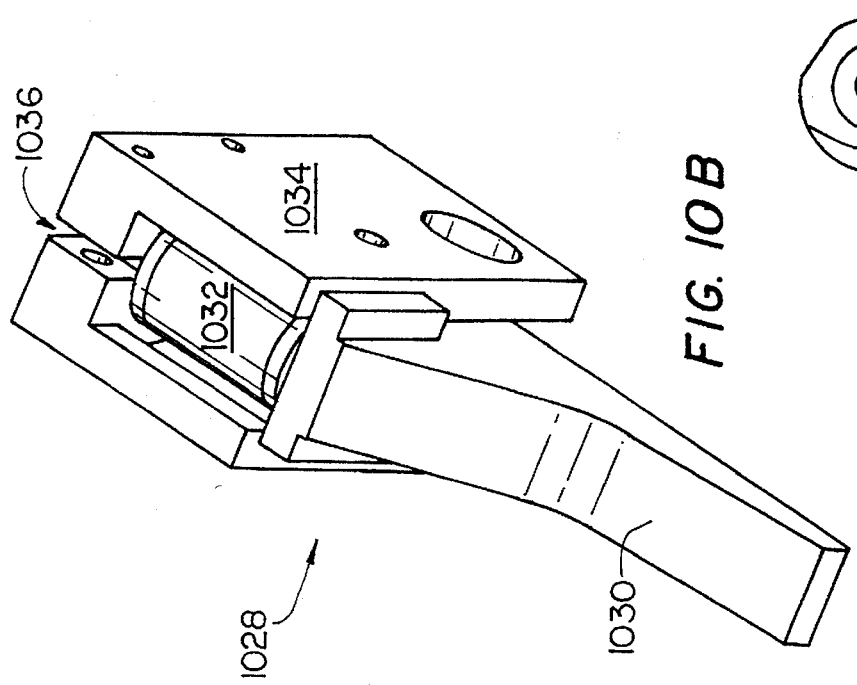
FIG. 10B illustrates the gripper actuator.

Force is applied to each flexure 1000 by an actuator 1028 (215) shown in FIG. 10B. The actuator includes a lever 1030 and a bellows 1032 which is disposed in a frame 1034. The bellows is substantially hollow and has an air intake 1036. As such, the bellows is operative to expand or contract in response to air pressure at the intake. As the bellows expands, force is applied thereby to the lever, which in turn applies force to the center bar of the flexure where the V groove blocks are placed. This allows the grippers to be spread for wafer insertion when the rotor is positioned by drive 222 with the actuators 1028 aligned with the grippers for so spreading them.

Figure 11:
FIG. 11 illustrates a wafer scanning pattern achievable with the measurement station.

Referring now to FIGS. 1–4, once the wafer is secured in place, the rotor is rotationally accelerated by clutched drive 222, causing the wafer to rotate similarly. As the rotor coasts after drive declutching, the sensor 210 is then moved linearly in an axis 232 substantially or typically parallel with the wafer rotation plane between the edge of the wafer and the center of the wafer as the wafer is rotated, thereby scanning the surface of the wafer. Referring briefly to FIG. 11, a resultant spiral scanning pattern is provided by moving the sensor linearly with respect to the rotating wafer. It will be appreciated that corresponding scan arms and sensors disposed on either side of the rotating wafer can make simultaneous measurements based on both surfaces of the wafer.

Figure 18:
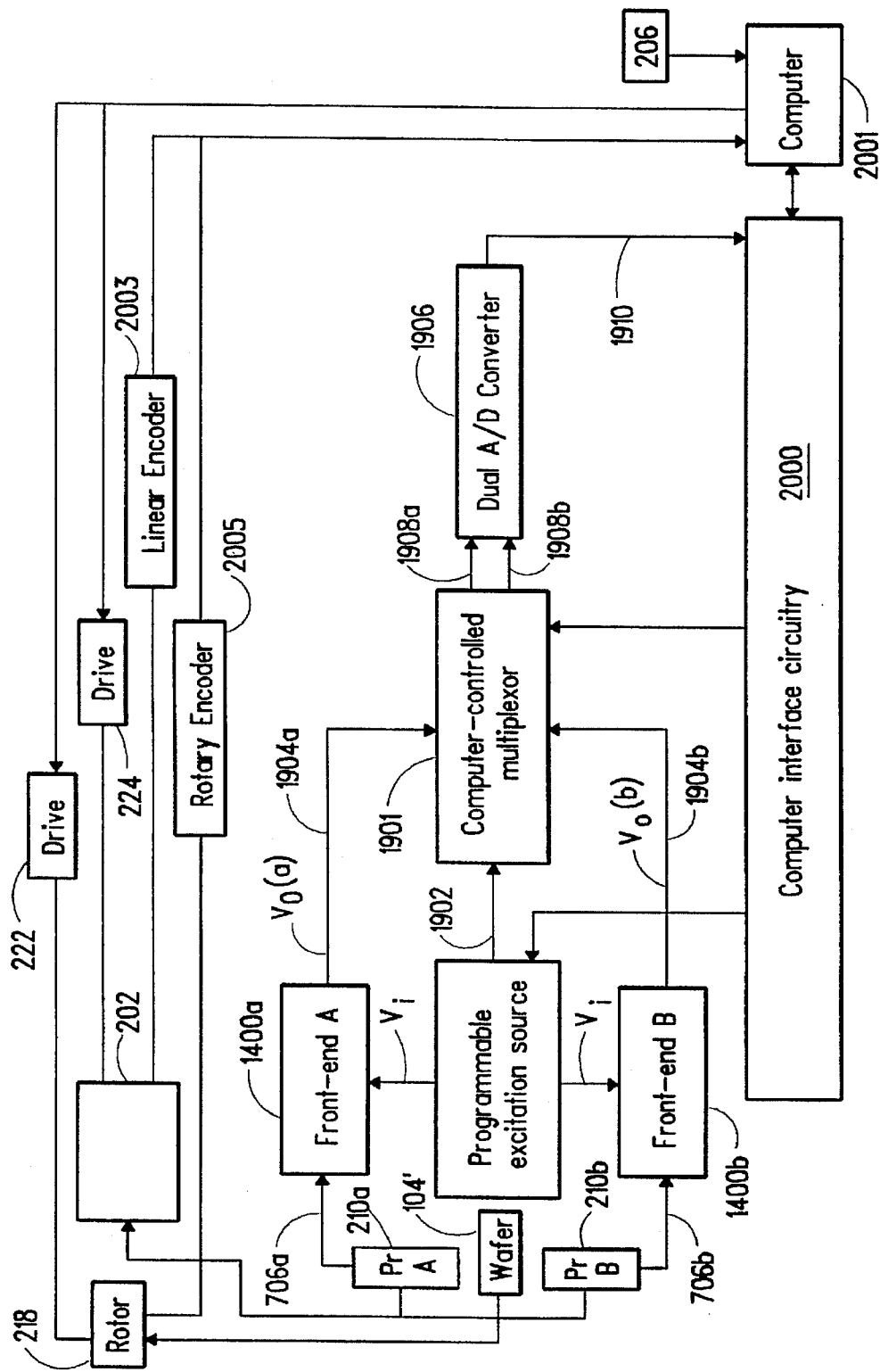
FIGS. 18–19 are flow charts which illustrate measurement data processing in accordance with the present invention.

The motion of the probes is effectuated by a servo loop illustrated in FIG. 18. A computer 2001 receives rotor angle from an angular encoder 2005, comprising head 219 and scale 219a during coasting. The linear drive 224 drives arm support 202 such that the output of linear encoder 2003, showing probe linear position, is coordinated to achieve a preset spiral or other tracing pattern. The spiral trace is controlled by computer 2001 to start at the same predetermined location with respect to the fiducial.

Figure 6A:
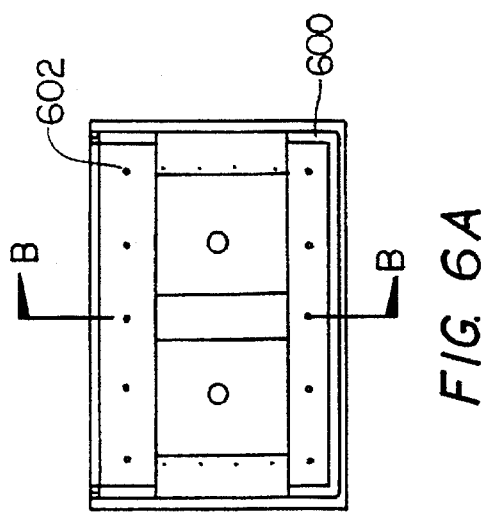
FIG. 6A is a bottom view of a linear air bearing.
Figure 6B:
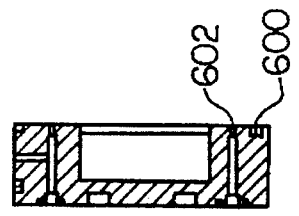
FIG. 6B is a cross-sectional view of the bearing of FIG. 6A taken along line B—B.
Figure 13:
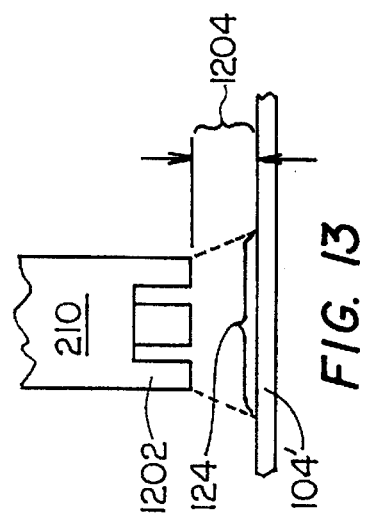
FIGS. 12–13 illustrate the sensor probe.
Figure 12:
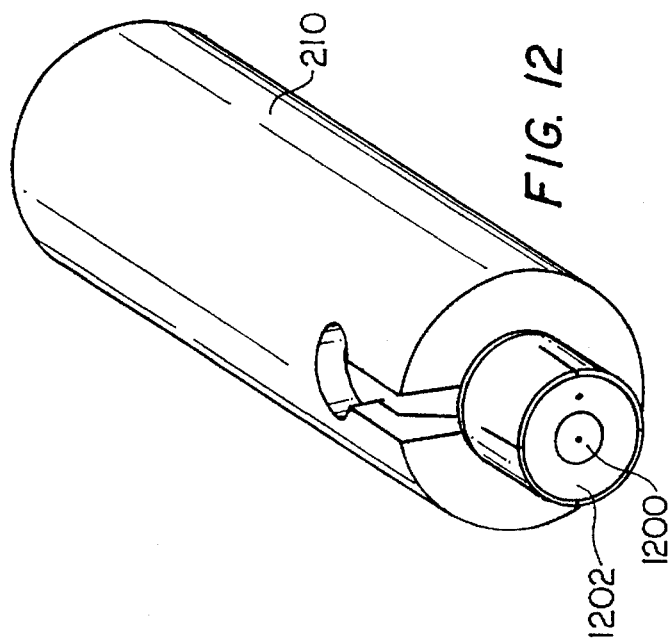

As shown in FIGS. 6A–6B, the linear air bearing includes vacuum ducts 600 and pressure ducts 602 which allow the sensor arm 208 to move on a cushion of air along the guide rail 204. The pressure ducts provide air pressure to lift the sensor arm while the vacuum ducts scavenge air escaping under pressure from the pressure ducts to diminish the possibility of introduction of contaminants to the wafers and preload the bearings.

Referring now to FIGS. 3, 4 & 12–13, the sensor is a capacitive displacement sensor with inner and outer capacitive plates 1200, 1202, respectively. The sensor corresponds to that shown in U.S. Pat. No. 4,918,376 and incorporated herein by reference. The sensor has a capacitance which varies in inverse proportion to the distance 1204 between the sensor and the measured surface. Along with a wafer surface area being measured, the sensor forms a three plate capacitor from which measurements can be made. More particularly, the output of the sensor is an AC signal $V_o$ of known period representing the distance between the sensor and the measured surface of the wafer 124. A wafer's characteristic thickness, flatness and shape including bowing and warping are determined from the sensor output using known technology as for example in U.S. Pat. Nos. 3,990,005, 4,860,229, and 4,750,141 incorporated herein by reference.

Figure 2:
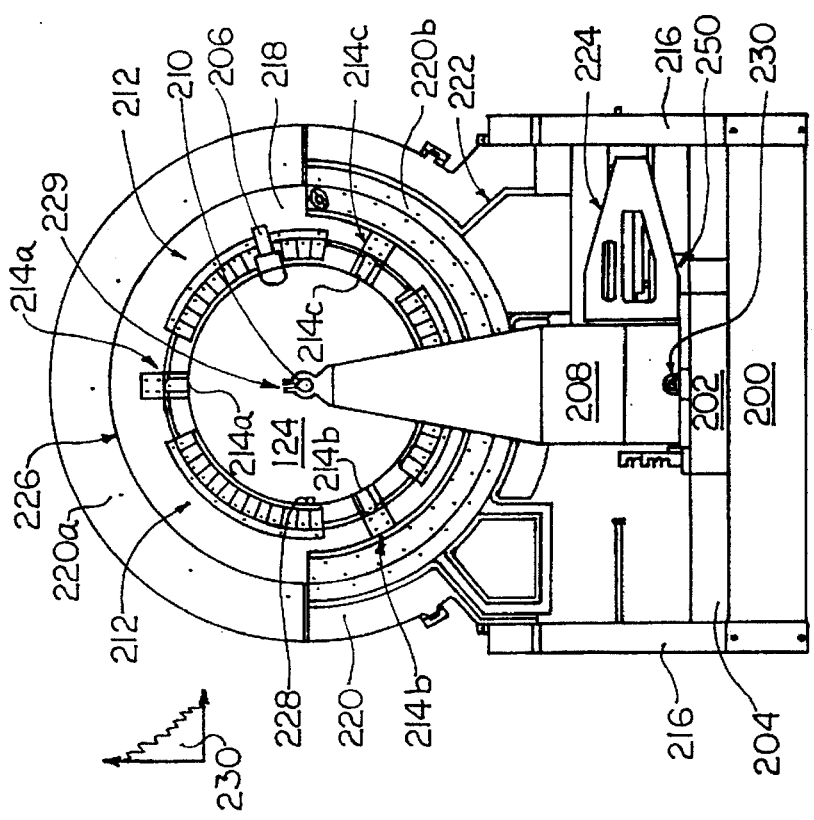
FIG. 2 is a front view of the measurement station of FIG. 1.
Figure 5:
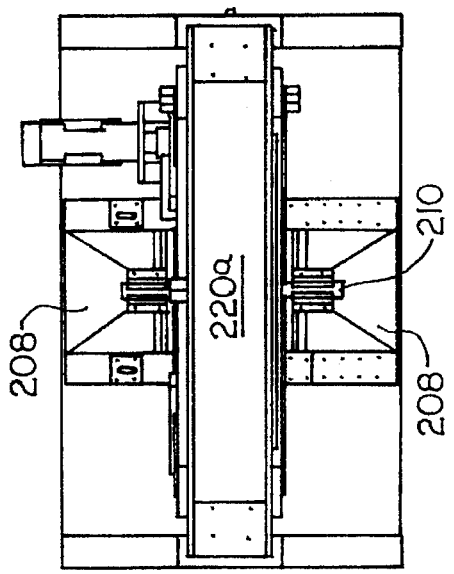
FIG. 5 is a top view of the measurement station.
Figure 6:
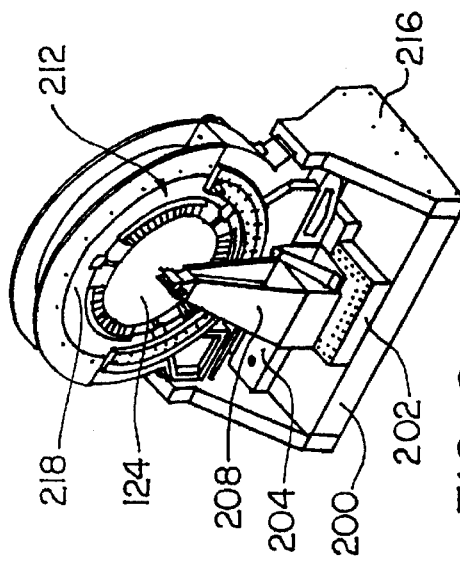
FIG. 6 is a perspective view of the measurement station.
Figure 4:
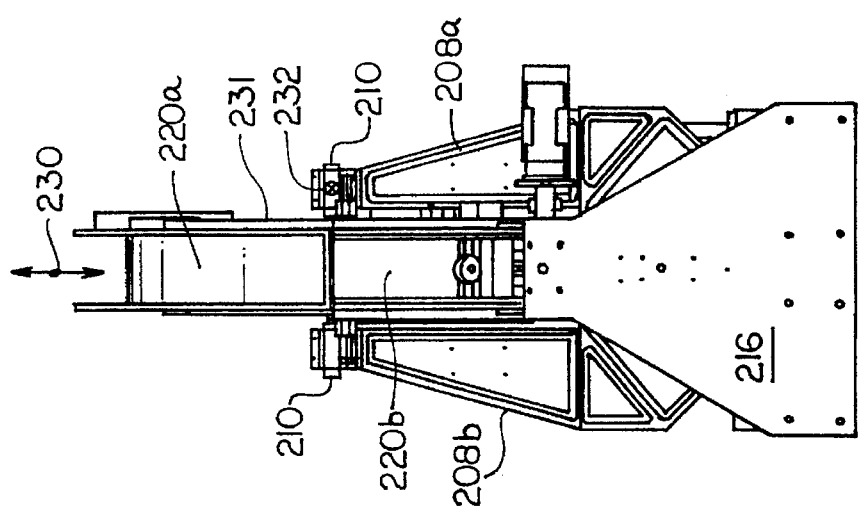
FIG. 4 is a side view of the measurement station.

Referring again to FIGS. 2–6, the measurement station also utilizes features which improve measurement accuracy by reducing measurement station vibration during operation. For example, the probe arm 208 of FIG. 2 is kinematically mounted to the air bearing 202 through journal and pin couplings 230 to minimize distortion due to manufacturing and alignment tolerances. The kinematic mounting minimizes measurement artifacts due to nonideal behavior of the air bearing during linear movement of the probe arm.

As shown in FIGS. 14, 15A, 15B 15C and 16, the rotor 218 is supported by an air bearing system consisting of itself (the rotor) and four surfaces of the stator assembly. There are two thrust bearing surfaces 3004 and two radial bearing surfaces 3000. These surfaces are fed by a vacuum source 1604 and a pressure source 1606. Channels in the thrust bearings 3004 and the radial bearings 3000 connect the vacuum and pressure to the interfaces between the rotor and the bearings in the stator. Positive pressure air that is applied to the thrust and radial bearings pushes the rotor away from the bearings and thereby creates a gap between the rotor and the bearings. In this manner the rotor rides on a cushion of air. The vacuum source is supplied to scavenging features 3008 at the edges of the interface and to pockets within the stator. The vacuum is balanced with the pressure source to retrieve the air flowing from the pressure source channels and to preload the rotor against the radial bearings. The scavenging feature 3008 reduces the possibility that impurities in the pressurized air or in the environment might be deposited on the wafer.

Figure 7:
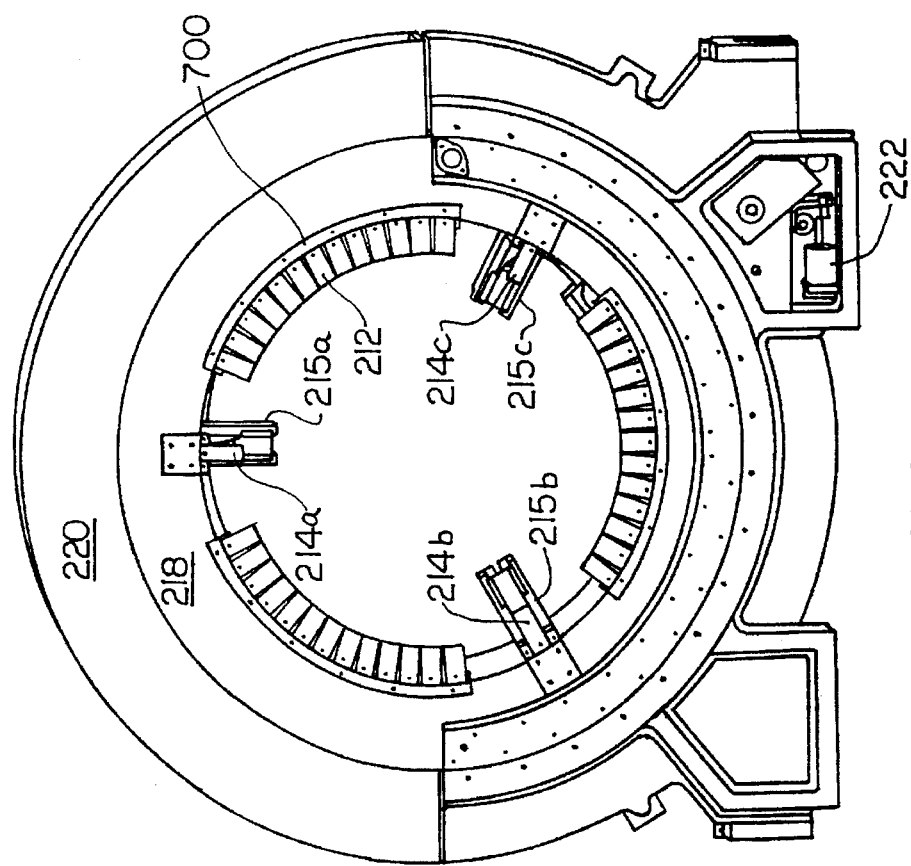
FIG. 7 further illustrates the rotor.
Figure 17:
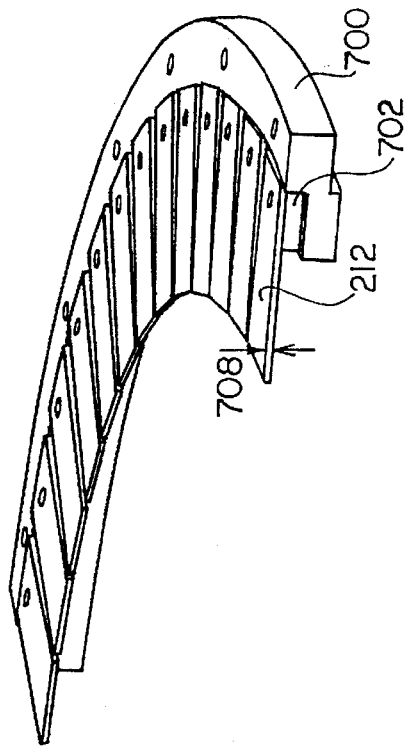
FIG. 17 illustrates the master calibration gauges.
Figure 16:
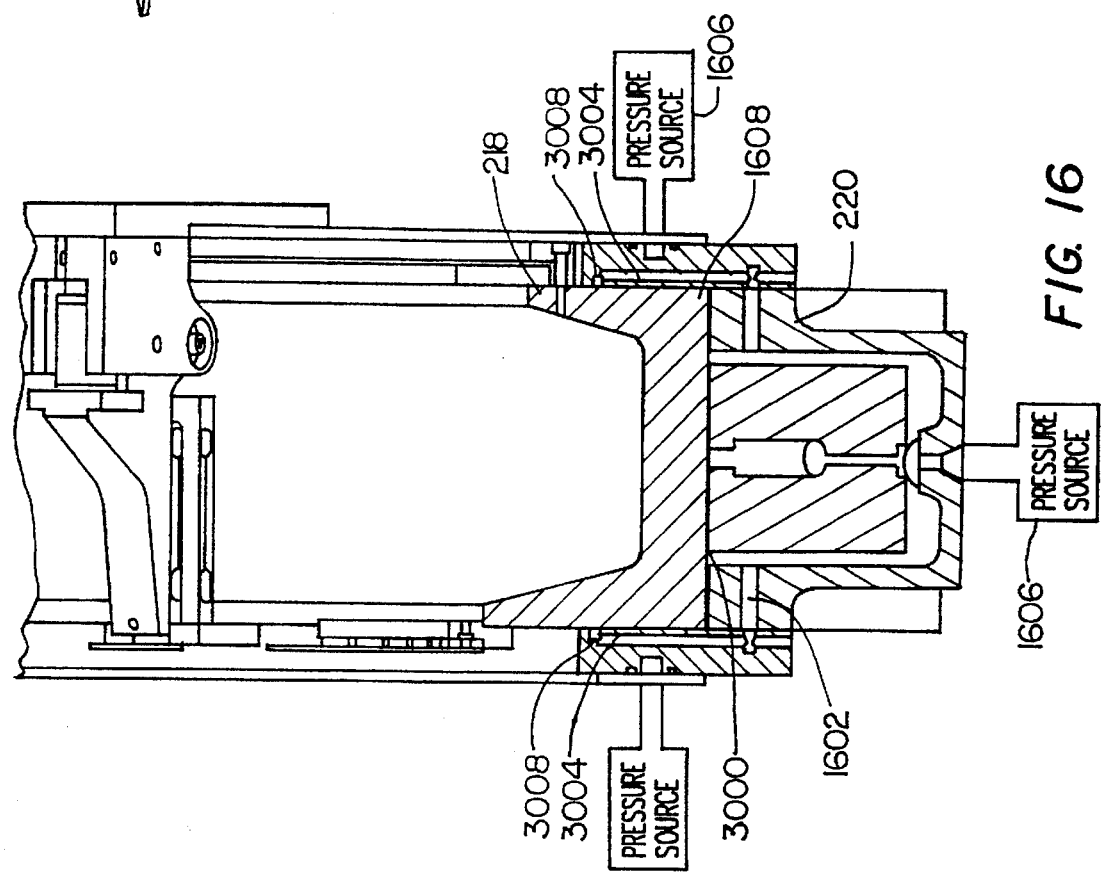
FIG. 16 is an expanded cross-sectional view of the arcuate air bearing of FIG. 14.

Referring to FIGS. 7, 17, the measurement station includes master calibration gauges ("masters") 212 which are utilized to increase accuracy and throughput. In the preferred embodiment, the rotor 218 includes thirty detachable carbide steel masters 212 with five possible thicknesses and nineteen different spacers to provide different axial positions. The thirty masters are divided into three sets and arranged co-planar to that of the vertical wafer with slight displacements for calibration purposes. Each set includes a detachable master arc 700, and each master 212 is connected to the master arc through a shim 702. Because there are six calibration parameters and thirty data points are obtained from the masters, the thirty data points provide redundant data allowing statistical fitting and operation with less than all thirty masters. Calibration with the masters can be carried out either before or after wafer measurement and can be completed in a relatively short period of time since there is no need to insert and remove a reference wafer. Hence, it may be desirable to compute calibration both before and after measurement of a wafer to compensate for thermal drift error.

In order to calibrate with the masters 212, the rotor is first accelerated to a rotational speed and the masters are measured by the capacitance sensor. The output of the capacitive sensors is converted to digital values which are indicative of sensed capacitance. In this way, linearity, scale factor and offset are determined simultaneously, without the need for shuffling standard or reference wafers into and out of the measurement station.

The masters provide comparative points of thickness/capacitance variation from which calibration constants are calculated by a statistical fit of the parameters of the probe transfer function to the data taken from the masters in computer 2001. After calibration data is gathered, linearity, scale-factor, and offset parameters for each of the capacitive transducer channels are adjusted in accord with modeled transducer behavior. A least squares fit is used to ascertain the optimum result. The model of the output of an individual capacitive transducer is:

$$V_o = \frac{K}{C_p} + V_{ofs} \qquad \text{Eq. 2}$$

where:

$V_o$=output voltage;

K=transducer scale factor;

$C_p$=probe capacitance; and

Vofs=offset voltage.

The probe capacitance is:

$$c_p = \frac{\epsilon_o A}{d} + c_o \qquad \text{Eq. 3}$$

where:

$e_o$=permittivity of free space;

A=area of capacitive sensor;

d=sensor-to-target spacing; and $c_o$=an offset capacitance.

When Eq. 2 is substituted into Eq. 1, the result is:

$$V_0 = \frac{Kd}{\epsilon_0 A + c_0 d} + V_{ofs} \quad \text{Eq. 4}$$

When the term $c_o$ is zero, then Eq. 4 is linear in d, which is the optimum case.

To make differential thickness measurements using two capacitive probes the analysis software subtracts the distance output of each transducer channel from the spacing between the probes. To do so, equation three is solved for d and then substituted into Eq. 5 below.

$$thk_g = D - (d_a + d_b) \quad \text{Eq. 5}$$

where:

$thk_g$=thickness as measured by gage;

D=spacing between probes;

$d_a$=distance as measured by transducer a; and $d_b$=distance as measured by transducer b.

For measurements taken during the calibration procedure, the thickness error is the square of the difference between the master thickness and the measured thickness. The sum of the squares thus defines a function:

$$f(k_a, k_b, c_{oa}, c_{ob}, V_{offs_a}) = (thk_{m1} - thk_{g1})^2 + (thk_{mn} - thk_{gn})^2 \quad \text{Eq. 6}$$

where:

$thk_{mn}$=thickness of nth master; and $thk_{gn}$=measured thickness of nth master.

In this function the output of each transducer is described as the function of three variables and probe area is assumed constant. Hence, a seven dimensional surface is described. To find the minimum error, the lowest point in the surface is calculated.

Figure 14:
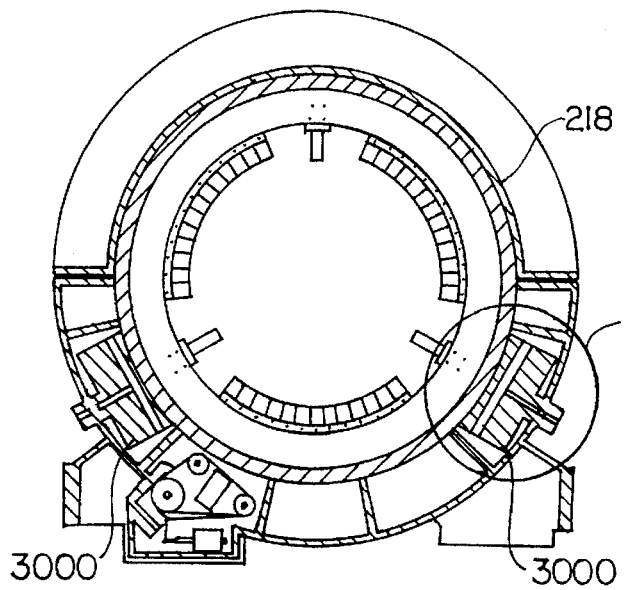
FIG. 14 is cross-sectional view of the stator and rotor taken along line B—B of FIG. 15A.
Figure 15A:
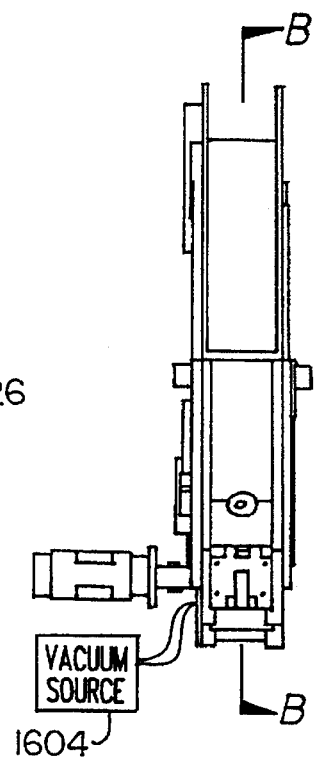
FIG. 15A is a side view of the stator and rotor.
Figure 15B:
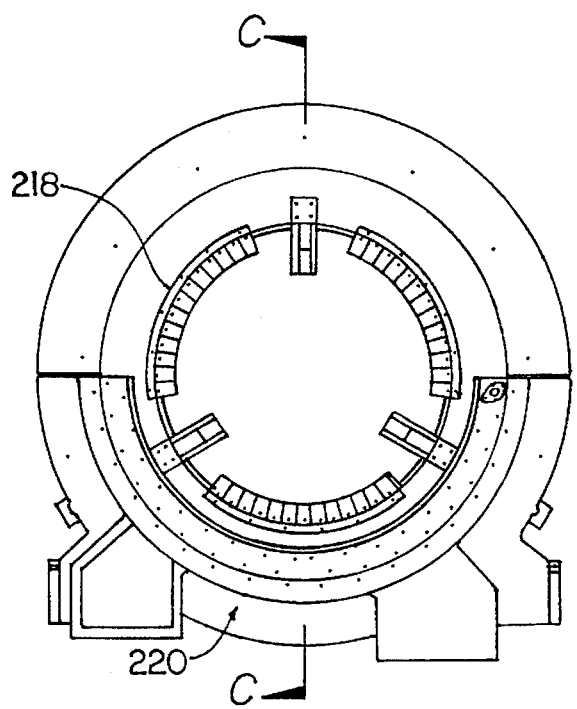
FIG. 15B is a front view of the stator and rotor.
Figure 15C:
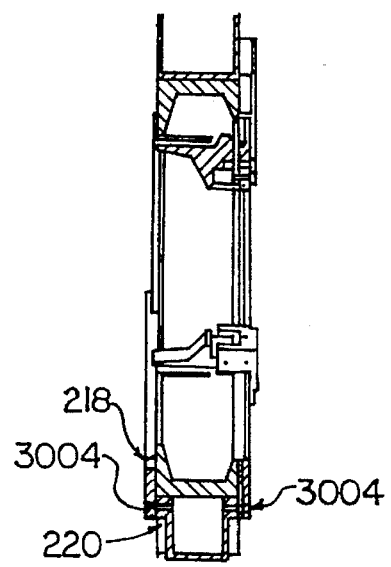
FIG. 15C is a cross-sectional view taken along line C—C of FIG. 15B.
Figure 19:
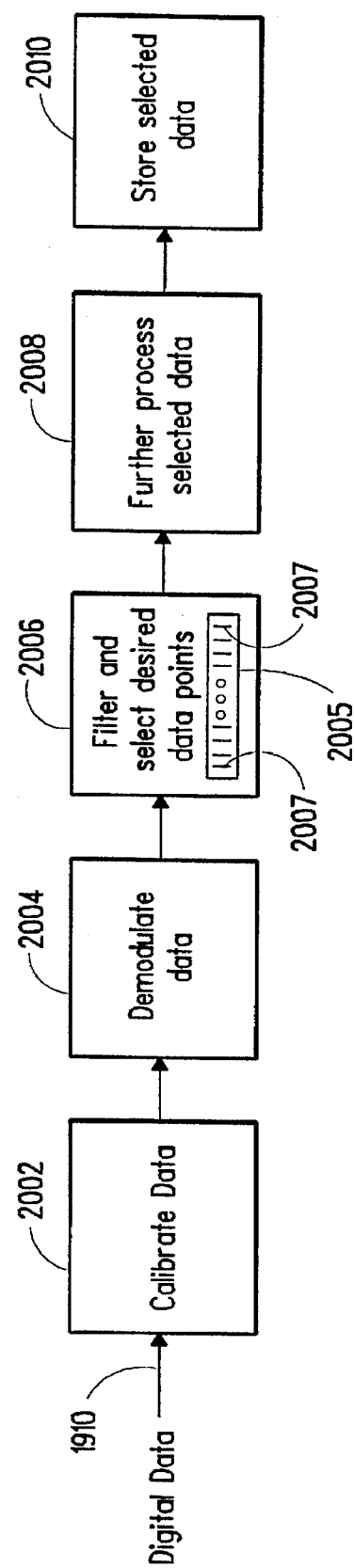

Referring to FIGS. 14, 19–20, data processing during a measurement or calibration cycle is improved through direct digitization of the sensor output. As previously described, the sensor front ends 1400a, 1400b provide sinusoidal output signals $V_o(a)$, $V_o(b)$ of varying amplitude which reflect distance variation. The sinusoidal output signals of front-ends A and B are converted to digital values in the dual A-D converter 1906. The multiplexer 1901 substitutes a reference signal for the probe signals whenever it is required to characterize the A-D converters. The A-D converters sample the analog signals 1908a, 1908b at three times per cycle to provide a digital data output stream 1910 which is provided to a computer 2000 for processing. Sampling points are periodic and equally spaced.

A high resolution, AC accurate, sigma-delta analog to digital converter with typically 20-bit resolution, low noise, very good differential nonlinearity and conversion rates up to about 50 KHz is utilized for the A-D conversion. The A-D converter 1906 is used to directly digitize the outputs of the probe front-ends. The A-D converter is clocked synchronously at three times the probe excitation frequency. Demodulation, calibration, scaling, and other desired arithmetic operations are performed in the digital domain. Direct digitization advantageously eliminates much of the analog circuitry previously required.

The computer interface 2000 and computer 2001 execute software which is operative to provide wafer measurement data from the digital data stream 1910. In a first step 2002 the digital data is linearized and scale factor settings are applied. In other words, the calibration data is applied to the digital data. In a second step 2004 the data output of the first step is synchronously demodulated. Demodulation of the data entails multiplying the data output by a reference sinewave having the same phase and frequency as the excitation signal. Typically demodulation is done digitally. The demodulation step 2004 provides a baseband signal which is then digitally filtered in a filtering step 2006 to remove the side bands and reduce noise. In order to select particular spots on the wafer at which measurements are to be taken, the output of the dual A/D converter is electrically tagged where the probes are looking at those points on the wafer. The electrical tags are used by the signal processing circuitry to decide which readings to save for storage subsequent processing, and which readings to discard.

Having described preferred embodiments of the invention, it will be apparent to one of skill in the art that other embodiments incorporating their concepts may be used. Accordingly, the invention should only be limited by the spirit and scope of the appended claims.

What is claimed is:

1. A fixture for rotationally supporting a semiconductor wafer for testing one of at least flatness, thickness, and shape, comprising:

a rotor having plural grippers distributed therearound for holding a wafer for rotation;

an encoder for indicating electronically the rotary position of the rotor;

grippers distributed around said rotor for holding a wafer vertically in said rotor within V-groove blocks;

said grippers having a W-shaped support with slit arms functioning as parallelograms between the V-groove block attached at the inner W arm, and attachments to the rotor at the outer W arms;

a resilient suspension for said grippers providing resilient spring loading against at least two of the grippers, said at least two grippers being held against motion toward the wafer beyond a predetermined position with respect to said rotor during wafer support in said grippers;

a plurality of calibration gauges supported on said rotor in the plane of said wafer and of varying thickness and position and grouped in plural segments detachable from the rotor and with the gauges detachable from each segment;

wafer test probes providing distance representing output signals and supported in a probe arm movable in a plane substantially parallel to a plane of a wafer when supported in said fixture over a surface to gauge the distance to a wafer between them as supported in said rotor;

a central elongated raised portion of said surface mating with an air suspended probe arm support, on which said probe arm is kinematically supported;

a linear encoder defining electronically the linear position of the probe arm over the surface;

a rotor drive for imparting rotation to the rotor and for disengaging the rotor to permit coasting thereof;

a probe arm drive imparting linear motion to said probe arm to cause said probes to move across opposite surfaces of a wafer in coordination through said encoders with coasting of said rotor to cause coordinated movement of the probes in a predetermined pattern across a surface of the wafer and for imparting scanning by said probes of said calibration gauges;

a measurement controller connected to the rotor drive and probes for taking data during coasting of said rotor at selected points in said pattern and said calibration trace.

2. A signal processor for the probe distance representing output signals in claim 1 comprising:

AC excitation for said probes at a frequency, the output signals from which are corresponding AC signals of said frequency;

a digital sampler providing samples in digital form of the AC output signals occurring at least twice per cycle at said frequency and forming a sample stream of digital output signals for each probe;

a marker for a selected periodically occurring set of the signals in the sample stream of digital output signals;

a synchronous demodulator and baseband and noise filter for each sample stream yielding a stream of DC representing signals;

a deleter for non marked signals in the stream of DC representing signals.

3. A wafer measurement station operative to measure one or more physical characteristics of a wafer, comprising:

a fixed stator;

a rotor disposed within said stator, said rotor operative to rotate in a plane with respect to said stator by means of an air bearing disposed between said stator and said rotor;

a plurality of grippers disposed on said rotor, said grippers being operative to securely hold the wafer during measurement;

a sensor disposed on a linear air bearing and operative to move along an axis which is substantially parallel to said rotor rotation plane, whereby the wafer is held in the measurement station by the grippers, rotated in a plane and scanned by the sensor moving linearly in the scan axis, thereby providing a spiral scan path.

4. The measurement station of claim 3 wherein at least two of said grippers are stationary during measurement, and at least one of said grippers is movable during measurement.

5. The measurement station of claim 4 wherein said grippers are connected to said rotor by W-shaped support flexures with counteracting hinges.

6. The measurement station of claim 5 wherein each said flexure includes a base plate which is directly connected to said rotor, said base plate connected to two parallel arms at a first end, said two parallel arms connected to a center arm at a second end, said center arm connected to a gripper finger V-groove block at an opposing end to provide counteracting action, said counteracting action being assisted by splits formed in said arms, said splits having cutouts at either end to allow said arms to function as parallelograms, whereby upper and lower sections of each said arm may flex at different rates as said arms are flexed.

7. The measurement station of claim 3 including a plurality of calibration gauges disposed on said rotor substantially in a plane of said wafer as held by said grippers.

8. The measurement station of claim 7 including at least thirty master calibration gauges disposed on three equidistantly spaced master arcs on said rotor, said master calibration gauges each having a thickness value such that at least five different thickness values are represented by said master calibration gauges collectively.

9. The measurement station of claim 3 wherein said sensor is disposed on a kinematic mounting.

10. A fixture for rotationally supporting a semiconductor wafer for testing one of at least flatness, thickness, and shape, comprising one or more of:

a rotor having plural grippers distributed therearound for holding a wafer for rotation;

an encoder for indicating electronically the rotary position of the rotor;

grippers distributed around said rotor for holding a wafer vertically in said rotor within V-groove blocks;

said grippers having a W-shaped support with slit arms functioning as parallelograms between the V-groove block attached at the inner W arm, and attachments to the rotor at the outer W arms;

a resilient suspension for said grippers providing resilient spring loading against at least two of the grippers, said at least two grippers being held against motion toward the wafer beyond a predetermined position with respect to said rotor during wafer support in said grippers;

a plurality of calibration gauges supported on said stator in the plane of said wafer and of varying thickness and position and grouped in plural segments detachable from the rotor and with the gauges detachable from each segment;

wafer test probes providing distance representing output signals and supported in a probe arm movable in a plane substantially parallel to a plane of a wafer when supported in said fixture over a surface to gauge the distance to a wafer between them as supported in said rotor;

a central elongated raised portion of said surface mating with an air suspended probe arm support, on which said probe arm is kinematically supported;

a linear encoder defining electronically the linear position of the probe arm over the surface;

a rotor drive for imparting rotation to the rotor and for disengaging the rotor to permit coasting thereof;

a probe arm drive imparting linear motion to said probe arm to cause said probes to move across opposite surfaces of a wafer in coordination through said encoders with coasting of said rotor to cause coordinated movement of the probes in a predetermined pattern across a surface of the wafer and for imparting scanning by said probes of said calibration gauges;

a measurement controller connected to the rotor drive and probes for taking data during coasting of said rotor at selected points in said pattern and said calibration trace.

11. A signal processor for the probe distance representing output signals in claim 10 comprising one or more of:

AC excitation for said probes at a frequency, the output signals from which are corresponding AC signals of said frequency;

a digital sampler providing samples in digital form of the AC output signals occurring at least twice per cycle at said frequency and forming a sample stream of digital output signals for each probe;

a marker for a selected periodically occurring set of the signals in the sample stream of digital output signals;

a synchronous demodulator and baseband and noise filter for each sample stream yielding a stream of DC representing signals;

a deleter for non marked signals in the stream of DC representing signals.

\* \* \* \* \*